United States Patent
Kim et al.

[11] Patent Number: 5,885,898
[45] Date of Patent: Mar. 23, 1999

[54] METHOD FOR FORMING DIFFUSION BARRIER LAYER

[75] Inventors: Youn-Tae Kim; Chi-Hoon Jun; Jong-Tae Baek, all of Daejeon, Rep. of Korea

[73] Assignee: Electronics and Telecommunications Research Institute, Daejeon, Rep. of Korea

[21] Appl. No.: 710,517

[22] Filed: Sep. 18, 1996

[30] Foreign Application Priority Data

Nov. 17, 1995 [KR] Rep. of Korea ............... 1995-42072

[51] Int. Cl.[6] ................................................ H01L 21/44
[52] U.S. Cl. ..................... 438/663; 438/685; 438/648; 438/660
[58] Field of Search ............................ 437/190, 192, 437/247, 200; 438/649, 683, 660, 663, 664, 682, 685, 648

[56] References Cited

U.S. PATENT DOCUMENTS 5,043,300  8/1991  Nulman ........................... 437/200
5,612,253  3/1997  Farahani et al. .

OTHER PUBLICATIONS

A. Kalnitsky, et al "Effect of Low–Temperature RTA on the Conductivity of AsImplanted Layers . . . " J. Electrochem. Soc. vol. 141 No. 8 Aug. 1994 p. 2223.

N. Brun, et al. "$TiSi_2$ Integration in a Submicron CMOS Process" J. Electrochem. Soc. vol. 142, No. 6 p. 1987, Jun. 1995.

Journal of Vacuum Science & Technology A; Second Series vol. 14, No. 6 Nov./Dec. 1996; Youn Tae Kim, Chi–Hoon Jun, Jin–Ho Lee, Jong Tae Baek, and Hyung Joun Yoo; pp. 3245–3251.

*Primary Examiner*—Caridad Everhart
*Attorney, Agent, or Firm*—Antonelli, Terry, Stout & Kraus, LLP

[57] ABSTRACT

The present invention relates to a method for forming a diffusion barrier layer, the method comprising the steps of: forming an insulation membrane having an opening for exposing a diffusion region to a silicon substrate formed with the diffusion region of a predetermined conductivity; vacuum-evaporating a metal of high melting point to surface and sides of the insulation membrane and to an upper area of the diffusion region, to thereby form a metal layer; and forming on the metal layer a low resistance layer and a diffusion barrier layer according to first and second quick heating treatment steps under nitric or ammoniac atmosphere. Accordingly, the low resistance layer can be thinned out while the diffusion prevention layer can be quickly formed to thereby improve diffusion prevention characteristic and to reduce stress from an interface with the semiconductor substrate. Furthermore, the interface between the silicon substrate and the low resistance layer can be made even to thereby reduce volume change of the low resistance layer, so that junction leakage can be prevented.

5 Claims, 2 Drawing Sheets

METHOD FOR FORMING DIFFUSION BARRIER LAYER

BACKGROUND OF THE INVENTION

1. Field of the Invention

The present invention relates to a method for forming a diffusion barrier layer, and more particularly to a method for forming a diffusion barrier layer for simultaneously forming a low resistance layer by way of a two-step quick heating treatment at low and high temperatures.

2. Description of the Prior Art

As semi-conductor devices have become finer and more highly integrated, a multilayer metal wiring process calls for a diffusion barrier layer between silicon and aluminum alloy in order to prevent spiking and the like caused by precipitation of aluminum used as conductivity membrane in a thin diffusion layer.

The diffusion barrier layer is formed by mixture of nitrogen with metals of high melting point such as Ti, W, Ta, Mo and the like.

However, when the diffusion barrier layer is directly vacuum-evaporated to the silicon, contact resistance goes up, thereby causing a low resistance layer to form between the diffusion barrier layer and the silicon, and reducing the contact resistance.

The low resistance layer is formed with silicide in metal of high melting point for forming the diffusion barrier layer.

FIGS. 1(A), 1B and 1(C) a re process drawings for illustrating a forming method of diffusion barrier layer according to the prior art.

As illustrated in FIG. 1(A), a silicon substrate (11) formed with impurity diffusion region(B) is formed with an insulation membrane (15).

An opening (17) is formed at a predetermined area of the insulation membrane (15) by way of a conventional photolithographic method, thereby exposing the diffusion region (13).

As illustrated in FIG. 1(B), an overall surface of the aforementioned structure is vacuum-evaporated by metals of high melting points such as Ti, W, Ta, Mo and the like in thickness of 50~200 Å by way of sputtering method or chemical vapor deposition (CVD) method.

Successively, the surface is vacuum-evaporated by the metals of high melting points such as Ti, W, Ta, Mo and the like in thickness of 300~500 Å under nitric atmosphere by way of sputtering or CVD method.

The vacuum-evaporated layer is quickly heat-treated at a high temperature of 700~1,000 degrees celsius under the nitric or ammoniac atmosphere.

At this point, a unit high melting point metal layer formed at an upper area of the diffusion region (13) reacts with the silicon substrate, silicifies and becomes a low resistance layer (19), and the metal layer of high melting point containing the nitrogen is nitrified to become a diffusion barrier layer (21).

As illustrated in FIG. 1, the diffusion barrier layer (21) is vacuum-evaporated at an upper area thereof with aluminum or the like to thereby form a conductivity layer (43).

Then, the conductivity layer (43), diffusion barrier layer (21) and low resistance layer (19) are removed by way of photolithographic method which are vacuum-evaporated at the predetermined upper area of the isolation membrane (15) other than the opening (17).

In the aforementioned description, heat change reaction during the quick heating treatment occurs quite differently according to a processed temperature, and respective thickness of generated diffusion prevention layer and low resistance layer is determined accordingly as the reactions are all stopped the moment the two layers collide.

At this point, the metal having a high melting point reacts rapidly with the silicon and nitrogen, by which the diffusion prevention layer and the low resistance layer are thickly formed as well.

However, there is a problem in that, when the low resistance layer is thickly formed, the diffusion prevention layer becomes thin, thereby failing to form a thickness that is sufficient for prevention of diffusion.

There is another problem in that the silicon substrate and the low resistance layer become uneven at intersurfaces thereof, and stress is generated due to volume change of the low resistance layer thereby resulting in junction leakage.

SUMMARY OF THE INVENTION

Accordingly, it is an object of the present invention to provide a method for forming a diffusion barrier layer for thinning a low resistance layer and simultaneously forming a thick diffusion prevention layer.

It is another object of the present invention to provide a method of forming a diffusion barrier layer for evenly forming interfaces of a silicon substrate and a low resistance layer to thereby reduce the volume change of the low resistance layer, so that junction leakage can be prevented.

In accordance with the object of the present invention, there is provided a method for forming a diffusion barrier layer, the method comprising the steps of:

forming an insulation membrane having an opening for exposing a diffusion region to a silicon substrate formed with a diffusion region of a predetermined conductivity;

vacuum-evaporating a metal having a high melting point to a surface and sides of the insulation membrane and to an upper area of the diffusion region, to thereby form a metal membrane or layer; and forming on the metal layer a low resistance layer and a diffusion barrier layer according to a first and a second quick heat treatment steps under nitric or ammoniac atmosphere.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

A method for forming the diffusion barrier layer according to an embodiment of the present invention will be described in detail with reference to the accompanying drawings.

FIGS. 2(A), 2(B), 2(C) and 2(D) are process drawings for illustrating a method for forming diffusion barrier layer according to the present invention.

Figure 1A:
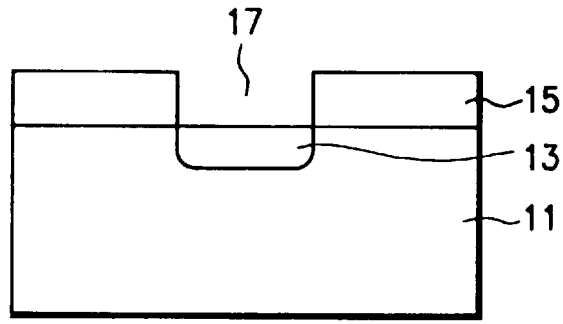
FIGS. 1(A), 1(B) and 1(C) are process drawings for illustrating a forming method of diffusion barrier layer according to the prior art.
Figure 1B:
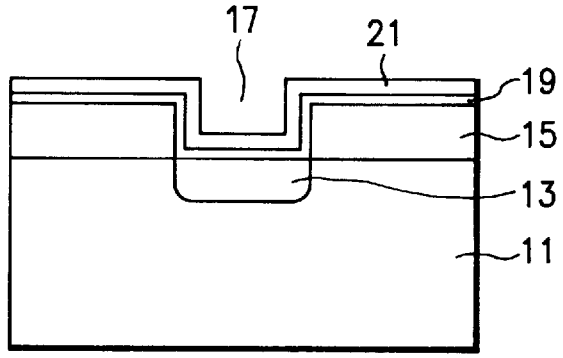
Figure 1C:
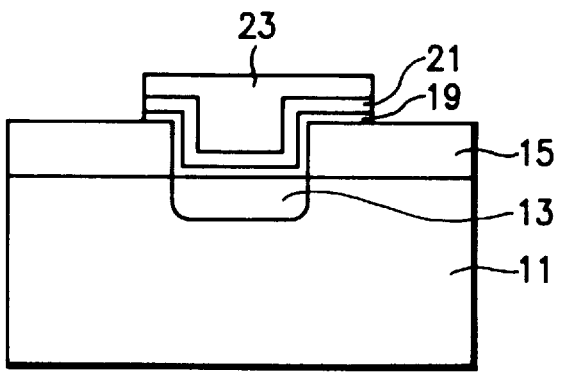
Figure 2A:
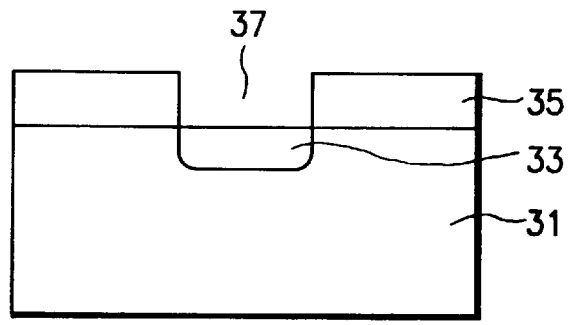
FIGS. 2(A), 2(B), 2(C) and 2(D) are process drawings for illustrating a forming method of diffusion barrier layer according to the present invention.

As shown in FIG. 2(A), a silicon substrate (31) formed with a diffusion region (33) doped by an n-type or p-type impurity is vacuum-evaporated by CVD method with $SiO_2$ and the like with a thickness of 4,000~7,000 Å, thereby forming an insulation membrane.

An opening(37) is formed at a predetermined area of an insulation membrane by way of a conventional photolithographic method, to thereby expose the diffusion region (33).

Figure 2B:
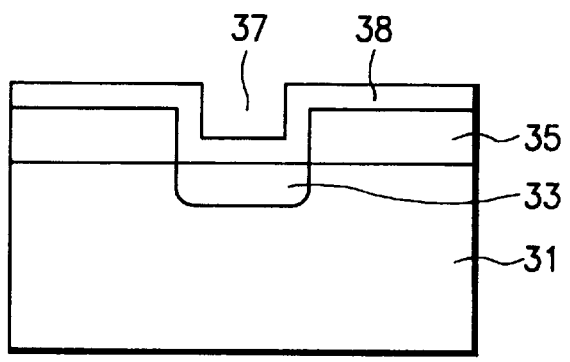

As illustrated in FIG. 2(B), whole surfaces of the aforementioned structure are vacuum-evaporated with such high-melting point of metals as Ti, W, Ta, Mo and the like with a thickness of 300~600 Å by way of sputtering method or CVD method to thereby form a metal membrane or layer (38).

At this time, the metal membrane (38) is formed not only on surface of the insulation membrane (35) but also on the surface of the diffusion region (33) exposed by the opening (37).

Figure 2C:
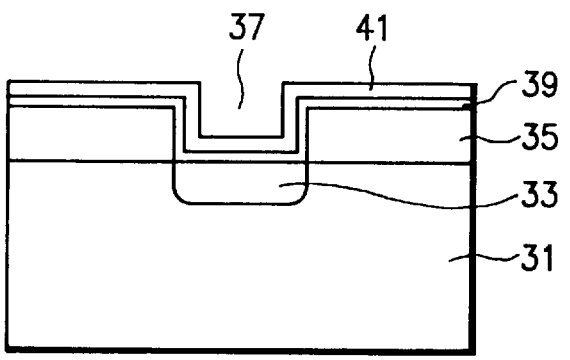
Figure 2D:
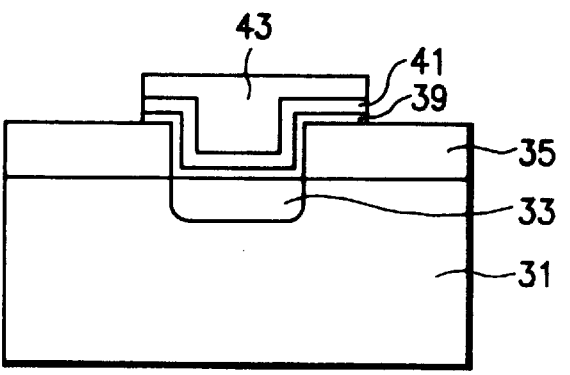

FIG. 2(C) illustrates a two step quick heating treatment process for treating the metal layer (38) under the nitric or ammoniac atmosphere, where the two step quick heating treatment process comprises: a first step for processing at low temperature of 400~500 degrees celsius for a time of approximately one to five minutes and a second step for processing at high temperature of 700~1,000 degrees celsius for a time of approximately 30~60 seconds.

During the first step of heat treatment, the nitrogen as atmospheric gas is diffused into the metal layer (38), and part of the diffused nitrogen reacts with metal to thereby form a diffusion barrier layer (41).

At this point, remnant nitrogen which has not reacted with the metal remains in the metal layer (38).

The nitrogen which has not reacted at the first step at the high temperature during the two step heat treatment and remained in the metal layer (38) serves to react with metal by supply of additional heat energy to thickly form the diffusion barrier layer (41).

Furthermore, the silicon substrate (31) and the interfaces of the metal layer (38) are reacted at a high temperature during the second step heat treatment to thereby form a low resistance layer (39).

Although the first step of the heating treatment is performed for comparatively long period of time, so that the nitrogen as atmospheric gas is fully diffused into the metal layer (38) to thereby form the diffusion barrier layer (41) having a good characteristic and sufficient thickness, there is no reaction between the silicon substrate (31) and the interfaces of the metal layer (38) due to the low temperature.

Furthermore, because the second step of the heating treatment is performed at a high temperature but for a short period of time, the intersurfaces between the silicon substrate (31) and the metal layer (38) are reacted to thereby be silicified, and a thin film low resistance layer (39) is formed.

The thin-film low resistance layer (39) serves to reduce stress at the interface with the silicon substrate (31).

In the aforementioned description, the low resistance layer (39) stops in all reactions thereof to thereby complete the formation the moment it is formed from the interface of the silicon substrate (31) to meet the diffusion barrier layer (41).

Furthermore, the density of the diffusion barrier layer (41) is increased during the two step heating treatment to thereby improve diffusion prevention characteristic, and the un-reacted remnant metal of high melting point is nitrated to thereby reduce surface resistance.

Nitrogen ion can be infused before the two step heating treatment in order to improve the composition ratio of the nitrogen in the above-formed diffusion barrier layer (41).

As shown in FIG. 2 (D), the diffusion barrier layer (41) is vacuum-evaporated at an upper area thereof with aluminum and the like to thereby form a conductivity layer (43).

The conductivity layer (43), diffusion barrier layer (41) and the low resistance layer (39) vacuum-evaporated to a predetermined upper area of the isolation membrane (35) are removed by way of photolithographic method, except for the opening (37).

As apparent from the forgoing, the present invention serves to form a metal layer by vacuum-evaporating metals of high melting point such as Ti, W, Ta, Mo and the like to an upper area of an isolation membrane having an opening for exposing a diffusion region and to an upper area of the diffusion region, with a thickness of 300~600 Å, and the vacuum-evaporated layer is processed under the nitric or ammoniac atmosphere by a two step heating treatment comprising a first step for the heating treatment for a period of time ranging from one to five minutes at low temperature of 400–500 degrees celsius, and a second step of the heating treatment for a period of time ranging 30–60 seconds at high temperature of 700–1,000 degrees celsius, to thereby form a diffusion prevention layer and a low resistance layer.

Accordingly, there is an advantage in that the low resistance layer can be thin while the diffusion prevention layer can be thickly formed to improve a diffusion prevention characteristic and to reduce stress from an interface with a semiconductor substrate.

Furthermore, there is another advantage in that an interface between the silicon substrate and the low resistance layer can be even to reduce volume change of the low resistance layer and to thereby prevent junction leakage.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A method for forming a diffusion barrier layer, said method comprising the steps of:

forming an insulation membrane having an opening for exposing a diffusion region to a silicon substrate formed of the diffusion region having a predetermined conductivity;

vacuum-evaporating a metal of high melting point to a surface and sides of the insulation membrane and to an upper area of the diffusion region, to thereby form a metal layer: and forming on the metal layer a low resistance layer and a diffusion barrier layer as first and second quick heating treatment steps under either of a nitric and ammoniac atmosphere, wherein the first quick heating treatment step is performed at a temperature of 400–500 degrees celsius for a period of one to five minutes.

2. A method for forming a diffusion barrier layer as defined in claim 1, where nitrogen as atmospheric gas is diffused into a metal layer when an interface between the silicon substrate and the metal layer is not reacted during the first quick heating treatment step, thereby causing part of the diffused nitrogen to react with metal and to form a diffusion barrier layer, and causing remnant nitrogen which has not reacted with the metal to remain in the metal layer.

3. A method for forming a diffusion barrier layer as defined in claim 1 wherein the nitrogen remaining in the metal layer which has not reacted at the first step of the two-step quick heating treatment reacts with metal according to supply of additional heat energy to thereby form a thick diffusion barrier layer, and the low resistance layer is formed by the interface between the silicon substrate and the metal layer being reacted.

4. A method for forming a diffusion barrier layer, said method comprising the steps of:

forming an insulation membrane having an opening for exposing a diffusion region to a silicon substrate formed of the diffusion region having a predetermined conductivity;

vacuum-evaporating a metal of high melting point to a surface and sides of the insulation membrane and to an upper area of the diffusion region, to thereby form a metal layer;

forming on the metal layer a low resistance layer and a diffusion barrier layer as first and second quick heating treatment steps under either of a nitric and ammoniac atmosphere; and infusing nitrogen ions to a metal layer before the first and second quick heating treatment steps.

5. A method for forming a TiN barrier layer, said method comprising the steps of:

forming an insulation layer having an opening for exposing a diffusion region to a silicon substrate formed by the diffusion region having a predetermined conductivity;

forming a Ti layer on an entire surface of the silicon substrate;

annealing the Ti-coated silicon substrate using a rapid thermal process with a sequential two-step thermal processing cycle in $NH_3$, wherein the two-step thermal processing comprises the steps of:

annealing in a low-temperature range of 400°–500° C. for one to five minutes to minimize Ti/Si interaction while maintaining Ti/$NH^3$ interaction and nitrogen diffusion through the Ti layer to maximize the thickness of the TiN barrier layer; and annealing at a high-temperature range of 700°–1000° C. for five to ninety seconds to reduce Ti/Si interaction during solicidation processing.

* * * * *